United States Patent
Shi et al.

(10) Patent No.: US 7,640,523 B1
(45) Date of Patent: Dec. 29, 2009

(54) SUBSTRATE VIA PATTERNS FOR OPTIMAL POWER DISTRIBUTION AND MANUFACTURABILITY IN SEMICONDUCTOR DIE PACKAGES

(75) Inventors: Hong Shi, Santa Rosa, CA (US); Yee Huan Yew, Penang (MY)

(73) Assignee: Altera Corporation, San Jose, CA (US)

( * ) Notice: Subject to any disclaimer, the term of this patent is extended or adjusted under 35 U.S.C. 154(b) by 198 days.

(21) Appl. No.: 11/747,189

(22) Filed: May 10, 2007

(51) Int. Cl.
*G06F 17/50* (2006.01)
*G06F 9/45* (2006.01)

(52) U.S. Cl. .................. 716/10; 716/1; 716/2; 716/5; 716/6; 716/9; 716/18; 703/13; 703/14

(58) Field of Classification Search .............. 716/1–3, 716/8–11, 18, 5–6; 703/13–14
See application file for complete search history.

(56) References Cited

U.S. PATENT DOCUMENTS

| 5,877,091 A * | 3/1999 | Kawakami .................. 438/737 |
| 6,417,463 B1 * | 7/2002 | Cornelius et al. ........... 174/263 |
| 7,107,561 B2 * | 9/2006 | Ali et al. ....................... 716/10 |
| 2006/0218514 A1 * | 9/2006 | Uchida ........................... 716/5 |

* cited by examiner

*Primary Examiner*—Thuan Do
*Assistant Examiner*—Nghia M Doan
(74) *Attorney, Agent, or Firm*—Martine Penilla & Gencarella, LLP

(57) ABSTRACT

The embodiments of the present invention provide methods for choosing a via layout pattern(s) for power distribution network in a package for a semiconductor die. The chosen via layout pattern allows the power distribution network to meet the limitation on the loop inductance in order to avoid causing a large $\Delta V$ affecting the functionality of semiconductor devices on the die. In addition, the chosen via layout pattern also meets the limitation of total number of vias allowed for the power distribution network in the package.

17 Claims, 11 Drawing Sheets

| VCCN PTH counts | Side by side | | Interleaving | | Interleaving 2 | | Scattering 1 | |
|---|---|---|---|---|---|---|---|---|
| | L(pH) | Total pth | L(pH) | Total pth | L(pH) | Total pth | L(pH) | Total pth |
| 4 | 199.6 | 8 | 108 | 8 | 142 | 8 | 155.6 | 8 |
| 8 | 108 | 16 | 52 | 16 | 64 | 16 | 79 | 16 |
| 16 | 56.7 | 32 | 25.5 | 32 | 30.5 | 32 | 39.7 | 32 |
| VCCN PTH counts | Scattering 3 | | Scattering 2 | | Surrounding 1 | | Surrounding 2 | |
| | L(pH) | Total pth | L(pH) | Total pth | L(pH) | Total pth | L(pH) | Total pth |
| 4 | 144.3 | 8 | 75.4 | 20 | 76 | 17 | 74.5 | 27 |
| 8 | 72 | 16 | 38 | 40 | 38 | 33 | 37 | 51 |
| 16 | 35.8 | 32 | 18.84 | 80 | 19 | 65 | 18.6 | 99 |

Fig. 5B

|  | L(pH) | Total pth |
|---|---|---|
| Surrounding 2 | 18.6 | 99 |
| Scattering 2 | 18.837 | 80 |
| Surrounding 1 | 19 | 65 |
| Interleaving | 25.5 | 32 |
| Interleaving 2 | 30.5 | 32 |
| Scattering 3 | 35.8 | 32 |
| Scattering 1 | 39.7 | 32 |
| Sidebyside | 56.7 | 32 |

Fig. 6

SUBSTRATE VIA PATTERNS FOR OPTIMAL POWER DISTRIBUTION AND MANUFACTURABILITY IN SEMICONDUCTOR DIE PACKAGES

BACKGROUND

Electronic components include electronic devices, such as field programmable gate arrays (FPGAs) and application specific integrated circuits (ASICs), supported on a printed circuit board (PCB). These electronic devices are manufactured on semiconductor substrates by sequential processing steps. Multiple electronic devices can be manufactured on a single substrate. These multiple electronic devices on the single substrate are sliced into multiple dies (or chips) after the sequential processing steps are completed and all the devices are formed. Prior to being placed on the PCB, these electronic devices (or dies) are placed in packages to allow the devices to be handled and to be electrically coupled to the PCB. There are vias and interconnects (wires) in packages that provide an electrical network for the die to be electrically coupled to the PCB and to enable access to other devices. The packaged dies are then disposed on the PCB through metallic connections, such as a ball grid array (BGA).

PCB provides power source(s) and grounding path(s) for devices on the packaged die to enable the functions of the devices on the die. The electrical paths for the power source and for grounding in the package, between the PCB and the die, are also being called the power distribution network for the devices. Power distribution networks create loop inductance, due to the opposing directions and proximity of the power paths and grounding paths. Loop inductance of the power distribution network reduces the voltage supplied by the power source on the PCB to the electrical devices on the die, defining a voltage drop ($\Delta V$). The voltage supplied by the power source is used to turn the devices on and off. In one embodiment, the voltage supplied by the PCB is DC voltage for devices such as FPGAs or ASICs. If the loop inductance is high, the voltage drop can be high enough to affect the on/off function the devices on the die.

The problem of loop inductance causing voltage drops is not so much of a concern when the operating voltage of the electronic device is at a relatively high voltage, such as 5.5 volts. Due to advancements in device technology, the operating voltage has steadily reduced from 5.5 volts to 3.3 volts, and to 1.8 volts, and lower. At low operating voltages, such as 1.8 volts, the voltage drop caused by the loop inductance can be high enough to affect the on/off function of the electrical devices (e.g. transistors) on the dies. The problem of loop inductance also becomes worse with increases in clock frequency, which decreases the amount of time a device is turned on or off (also called turn-on or turned-off time). When a device is turned on, the current through the device increases from zero to a current, $I_{on}$, within the turn-on time. Similarly, when a device is turned off, the current through the device decreases from $I_{on}$ to zero.

Equation (1) below shows the relationship between $\Delta V$ to inductance (L). Voltage drop ($\Delta V$) is about equal to inductance (L) multiplying dI/dt, which is current increase or decrease rate.

$$\Delta V = LdI/dt \quad (1)$$

As described above, higher clock frequency pushes the dI/dt value higher. At the same time, lower operating voltage for advanced devices pushes the acceptable $\Delta V$ lower. Therefore, the loop inductance must be reduced for advanced device operation.

In addition to device functionality concerns, the chip areas available for vias for power distribution networks on packages of dies and manufacturing cost of the vias also must be considered during the design of the power distribution network.

Therefore, there is a need for a method for choosing via layout patterns that meet the limits of loop inductance, available chip areas, and manufacturing cost.

SUMMARY

Broadly speaking, the embodiments of the present invention fill these needs by providing a method for choosing a via layout pattern(s) for power distribution networks in a package for a semiconductor die. The chosen via layout pattern allows the power distribution network to meet the limitation on the loop inductance in order to avoid having large $\Delta V$ affect the functionality of semiconductor devices on the die. In addition, the chosen via layout pattern also allow efficient use of allowed via counts available for power distribution networks in a package.

In one embodiment, a method for choosing a via layout pattern for a power distribution network in a package for a semiconductor die is provided. The method includes determining an upper limit of total number of vias available for power distribution for the package. The method also includes determining an upper limit of loop inductance for the semiconductor die. The method includes determining at least one via layout pattern. The loop inductance of the at least one via layout pattern does not exceed the upper limit of loop inductance. The upper limit of total number of vias of the at least one via layout pattern does not exceed the upper limit of total number of vias available. The via layout pattern defining a defined placement relationship between vias used for power and vias used for ground.

In another embodiment, a method for choosing a via layout pattern for a power distribution network in a package for a semiconductor die is provided. The method includes determining a relationship between each of a plurality of via layout patterns, a total number of vias of the each of the plurality of via layout patterns, and loop inductance of the each of the plurality of via layout patterns. The method also includes determining an upper limit of total number of vias available for power distribution for the package. The method further includes determining an upper limit of loop inductance for the semiconductor die. In addition, the method includes determining at least one via layout pattern of the plurality of via layout patterns that does not exceed the upper limit of loop inductance and the upper limit of total number of vias. The via layout pattern defining a defined placement relationship between vias used for power and vias used for ground. Additionally, the method includes choosing the via layout pattern out of the determined at least one via layout pattern.

In still another embodiment, a method for designing a via layout pattern for a power distribution network in a package for a semiconductor die is defined. The method includes determining a relationship between each of a plurality of via layout patterns, a total number of vias of the each of the plurality of via layout patterns, and loop inductance of the each of the plurality of via layout patterns. The method also includes examining a layout of a package to determine an upper limit of total number of vias available for power distribution for the package and identifying acceptable loop inductance for the semiconductor die. The method also identifies a via layout pattern from the plurality of via layout patterns, where the via layout patter is substantially within the acceptable loop inductance and the upper limit of total number of vias. The via layout pattern establishes a physical placement relationship between vias used for power and vias used for ground.

Other aspects and advantages of the invention will become more apparent from the following detailed description, taken in conjunction with the accompanying drawings, illustrating by way of example the present invention.

BRIEF DESCRIPTION OF THE DRAWINGS

The present invention will be readily understood by the following detailed description in conjunction with the accompanying drawings, and like reference numerals designate like structural elements.

FIG. 5B shows simulation results of loop inductance varying with the number of power PTHs and the number of total PTHs, in accordance with one embodiment of the present invention.

FIG. 6 shows minimal loop inductance values and total numbers of PTHs for eight exemplary via layout patterns for a power distribution network, in accordance with one embodiment of the present invention.

DETAILED DESCRIPTION

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

Figure 1A:
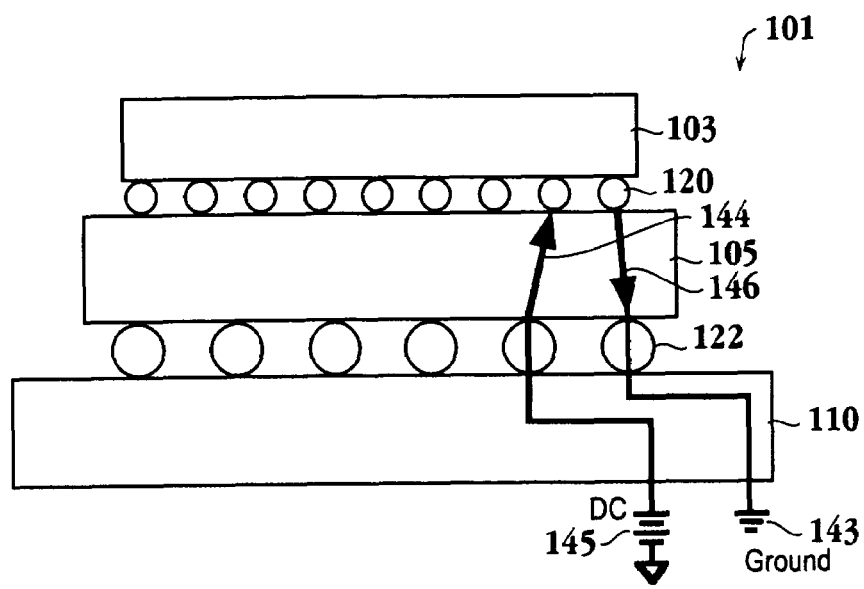
FIG. 1A is an illustration showing an exemplary cross-section of a die package disposed over a PCB, in accordance with one embodiment of the present invention.

FIG. 1A depicts one aspect of circuit package 101 according to one embodiment of the present invention. The circuit package 101 includes a die 103, a first substrate 105, a second substrate 110, connection bumps 120, and ball grid array (BGA) 122. Die 103 is a semiconductor chip, such as field programmable gate arrays (FPGAs), application specific integrated circuits (ASICs), flash memories, and complex programmable logic devices (CPLDs). Die 103 can also be other type of semiconductor chips. Substrate 105 is a package for die 103. Substrate 105 provides interconnects between die 103 and the second substrate 110 through chip connection bumps 120 and the solder balls 122, which is part of a ball grid array (BGA). In one embodiment, the second substrate 110 is a printed circuit board (PCB). In one embodiment, the second substrate 110 is coupled to a DC power supply 145 and a ground 143. The DC power supply 145 provides a supply voltage to die 103 to activate a device (not shown) on die 103 through a power path 144. The electric flow generated by the activated device is grounded through a return path 146. The supply voltage for the devices on die 103 could be a single voltage or multiple voltages, supplied by multiple power supplies. Examples of supply voltages for devices include, but not limited to, 5.0 V (volts), 3.3 B, 2.5 V, 1.8 V, and smaller, etc.

Figure 1B:
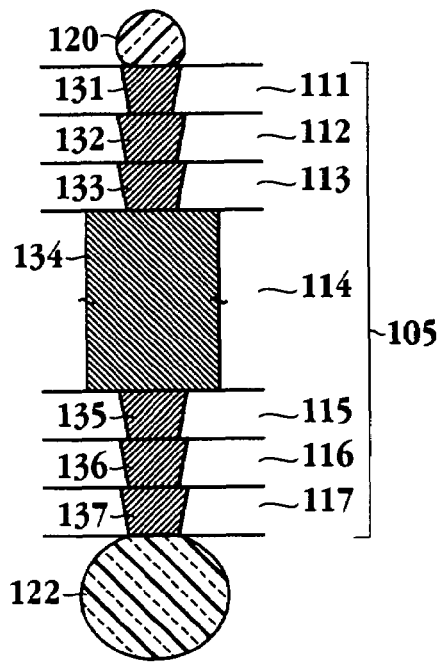
FIG. 1B is an illustration showing an exemplary cross-section of a via for a power distribution network of the first substrate of FIG. 1A, in accordance with one embodiment of the present invention.

FIG. 1B shows a cross-sectional side view of a via of a power distribution network of the first substrate 105, in accordance with one embodiment of the present invention. The via of the power distribution network provides either a power path or a ground path. As shown in FIG. 1B, first substrate 105 comprises 7 dielectric layers, 111, 112, 113, 114, 115, 116, and 117. In each of the 6 dielectric layers, 111, 112, 113, 115, 116, 117, there is a corresponding micro via, 131, 132, 133, 135, 136, 137. An exemplary thickness of each of the six dielectric layers 111, 112, 113, 115, 116, 117 is about 35 µm. The via stack of FIG. 1B includes micro via, 131, 132, 133, 135, 136, 137, and a plated through hole (PTH) 134. The micro vias 131, 132, 133, 135, 136, 137 are filled with conductive materials, such as copper or aluminum. In the dielectric layer 114, there is a PTH 134. Plated through hole (PTH) is also a type of via. The diameter of the PTH is much larger than the diameters of the micro vias. An exemplary thickness of dielectric layer 114 is about 800 µm. Methods for fabricating plated through holes 134 and micro vias 131, 132, 133, 135, 136, 137 are known in the art. Directly above micro via 131 is a chip connection bump 120, which is coupled to die 103 (not shown). Below micro via 137 is a solder ball 122, which is disposed on the second substrate 110 (not shown), which can be a PCB. Electrical signals capable of being transmitted between the chip connection bump 120 and solder ball 122, by micro vias 131, 132, 133, 135, 136, 137 and plated through hole 134 described above, include power signals, ground signals, and information signals.

In FIG. 1B, micro vias 131, 132, 133, 135, 136, and 137 are shown lined up in a straight vertical line along with PTH 134. However, the micro vias are lined up in a straight vertical line in FIG. 1B only to illustrate the existence of micro vias in each layer and the relatively smaller diameters of the micro vias, compared to the diameter of PTH. In a physical embodiment, the multiple micro vias are not lined up in a straight vertical line. There are design and manufacturing restrictions against having too many micro vias at different levels being stacked up on top of one another. Limited number micro vias are allowed to overlap or to be stacked, depending on the design restriction. Horizontal connections between dielectric layers 111, 112, 113, 114, 115, 116, 117 allow micro vias 131, 132, 133, 135, 136, 137 at different layers and PTH 134 that are not stacked in a vertical straight line to be electrically connected. In addition, the number of dielectric layers with micro vias and PTH 134 is only used as an example. The concept of the invention applies to different numbers of dielectric layers with different arrangements of micro vias and PTH.

Figure 2A:
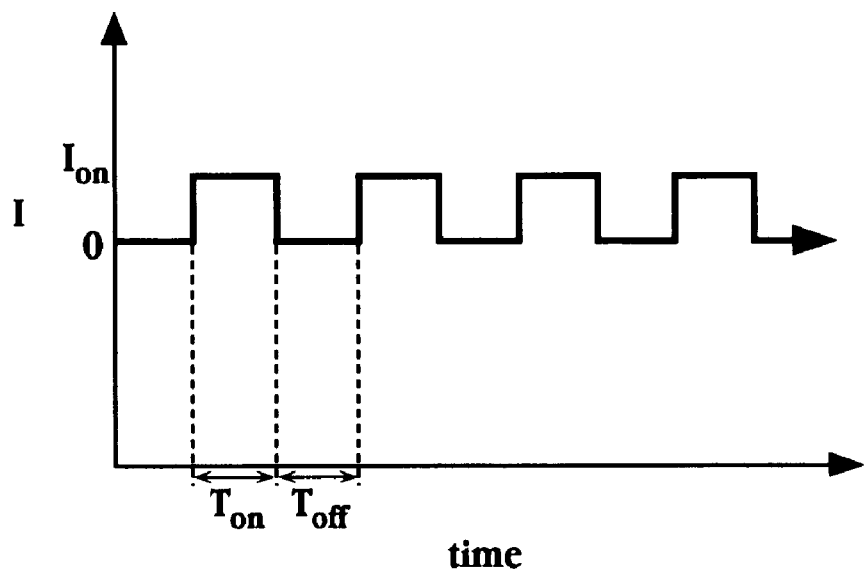
FIG. 2A is an illustration showing an exemplary on/off current signal pattern of a semiconductor device, in accordance with one embodiment of the present invention.
Figure 2B:
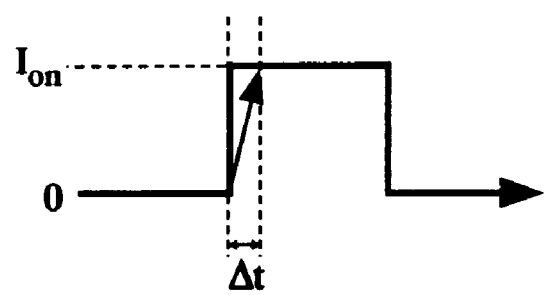
FIG. 2B is an illustration showing an exemplary on current signal with current increase from zero to $I_{on}$ in a short $\Delta t$, accordance with one embodiment of the present invention.

FIG. 2A shows an exemplary on/off current as a function of time for a device in die 103. As clock frequency increases for devices, the duration for an on ($T_{on}$) or an off ($T_{off}$) signal decreases. When a device is turned on, the current through the device increases from zero A (ampere) to $I_{on}$. FIG. 2B shows that within a very short time $\Delta t$, the current increases from zero A to $I_{on}$. For example for an ASIC device operating at 1.8V, $I_{on}$ could be about 20 mA and $\Delta t$ could be about 200 ps (Pico second). This makes $\Delta A$ to be about 20 mA. With such a rush of current through the micro vias and plated through hole, the conductive path shown in layer 105 of FIG. 1B becomes an inductor, which could create a voltage drop ($\Delta V$) that reduces the amount of DC voltage delivered to the devices in die 103. As described in equation (1), $\Delta V$ is proportional to $dI/dt$. The large $dI/dt$ value, such as $10^8$ mA/s for the example described above, can make $\Delta V$ significant. To minimize $\Delta V$, the viable option is to reduce the loop inductance L in equation (1).

Figure 3A:
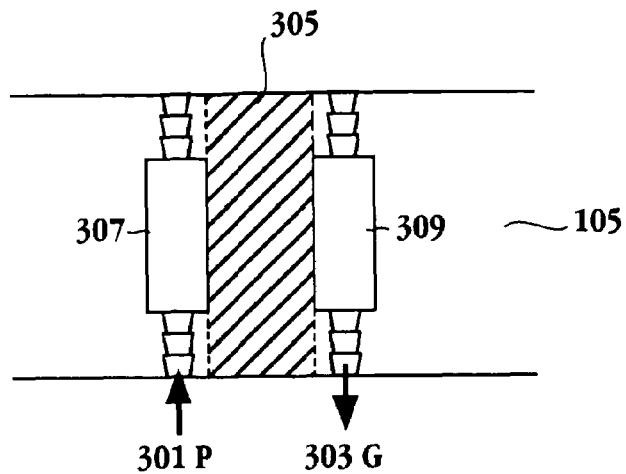
FIG. 3A shows two vias next to one another, in accordance with one embodiment of the present invention.
Figure 3B:
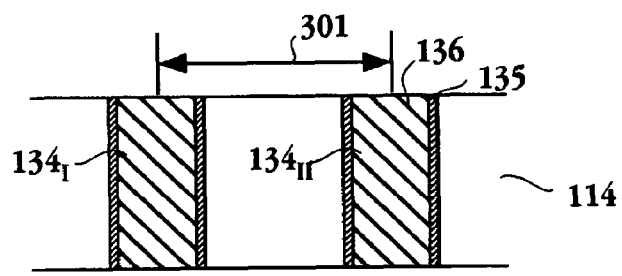
FIG. 3B shows two PTHs next to one another, in accordance with one embodiment of the present invention.

The inductance L that affects the voltage drop ($\Delta V$) is loop inductance, since there are both power paths, such as path 144 of FIG. 1A, and ground paths, such as path 146 of FIG. 1A, near the device(s) in die 103. Loop inductance is proportional to the loop area between the power path and ground path. FIG. 3A shows a power path 301 and a ground path 303 through layer 105. Between the power path 301 and the ground path 303 is an area 305. Loop inductance is proportional to the area 305 between the power path 301 and ground path 303. In one embodiment, to reduce area 305, either the thickness of dielectric layer 105 or the distance between the two plated through holes 307, 309 is reduced. Alternatively, both the thickness of the dielectric layer 105 and the distance between the two plated through holes 307, 309 are reduced to reduce area 305. Due to an isolation requirement, conductivity requirement, and manufacturing concerns for chip connection bumps, plated through holes, and solder balls, the distance 301 between the centers of two adjacent plated through holes, such as $134_I$ and $134_{II}$ of FIG. 3B cannot be unconditionally reduced. In one embodiment, the distance 301 needs to be equal to or greater than about 300 μm. Similarly, the thickness reduction of 105 might not be easily achieved for certain manufacturing processes. Therefore, it is desirable to seek loop inductance reduction through other means.

Figure 3C:
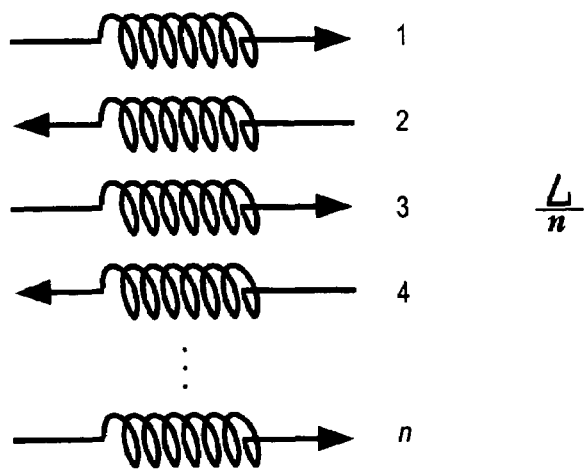
FIG. 3C shows n alternating inductors, in accordance with one embodiment of the present invention.

In one embodiment, a way to reduce loop inductance is by choosing a via (which includes micro vias and PTHs) layout pattern that would assist in limiting the loop inductance. If there are additional power paths and grounding paths aligned in an alternating fashion, the loop inductance can be reduced by the total number of these paths. FIG. 3C shows n alternating power paths and grounding paths. The loop inductance is reduced to L/n.

Figure 4A:
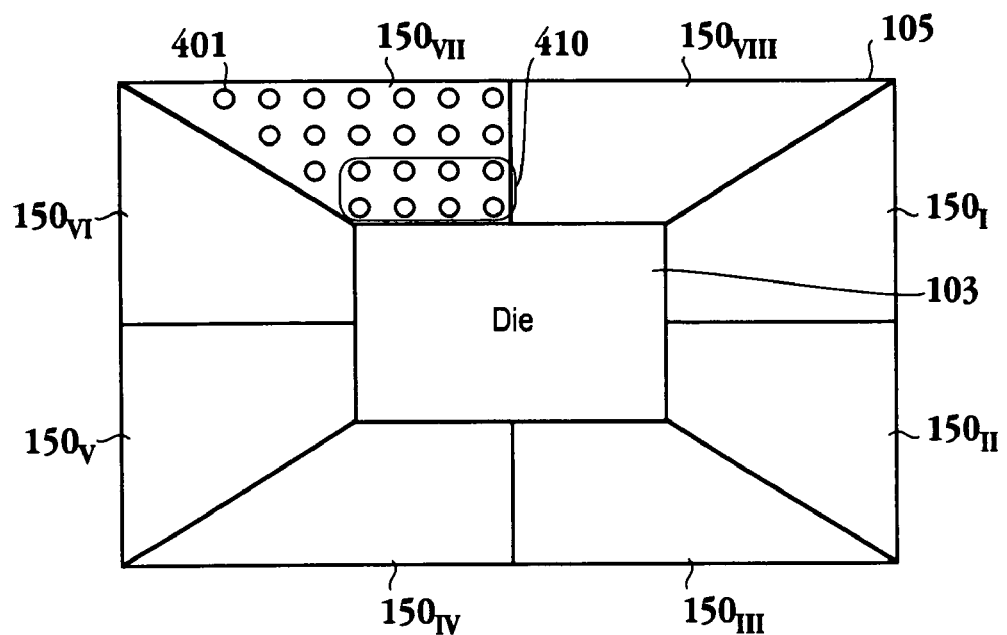
FIG. 4A shows a top view of a die coupled to a package, in accordance with one embodiment of the present invention.

As described above, the loop inductance can be reduced by increasing the number of alternating power paths and ground paths. However, increasing a large number of power paths and grounding paths might not be possible due to available chip areas on the first substrate 105, which is a package for die 103. FIG. 4A shows a top view of a die 103 on top of the first substrate 105, in accordance with one embodiment of the present invention. In this embodiment, areas $150_I$, $150_{II}$, $150_{III}$, $150_{IV}$, $150_V$, $150_{VI}$, $150_{VII}$, $150_{VIII}$, are used for different functions. These different areas are to provide power, information, and ground for different operating voltages, such as 2.5 V and 1.8 V, for devices on die 103. In the embodiment shown in FIG. 4A, only the area within area 410 is used to provide vias 401 for power paths and ground paths for a particular voltage, such as 1.8V. As can be seen, only eight vias 401 would fit inside the enclosed area 410. Under such circumstance, the upper limit for total number of vias for power paths and ground paths is eight.

Figure 4B:
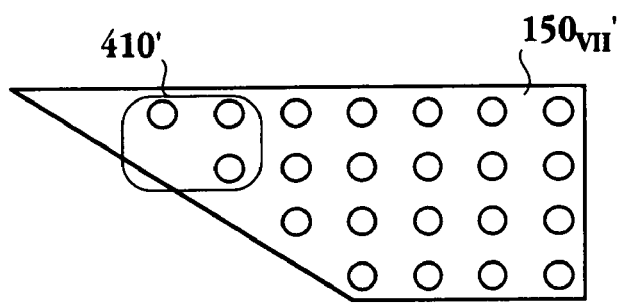
FIG. 4B shows a top view of an area of a package, in accordance with one embodiment of the present invention.

FIG. 4B shows another embodiment of area within outline 410' for power paths and ground paths for a particular voltage, such as 1.8 V. As can be seen in FIG. 4B, area 410' for power paths and ground paths is even smaller than area within 410, and only 3 vias fit inside the enclosed area 410'. Under such circumstance, the upper limit for total number of vias for power paths and ground paths is three.

In addition, adding vias could incur additional manufacturing cost, especially the manufacturing cost of plated through holes. Therefore, one embodiment defines a layout method for vias that achieves the acceptable loop inductance within the available chip area and manufacturing budget.

Figure 5A:
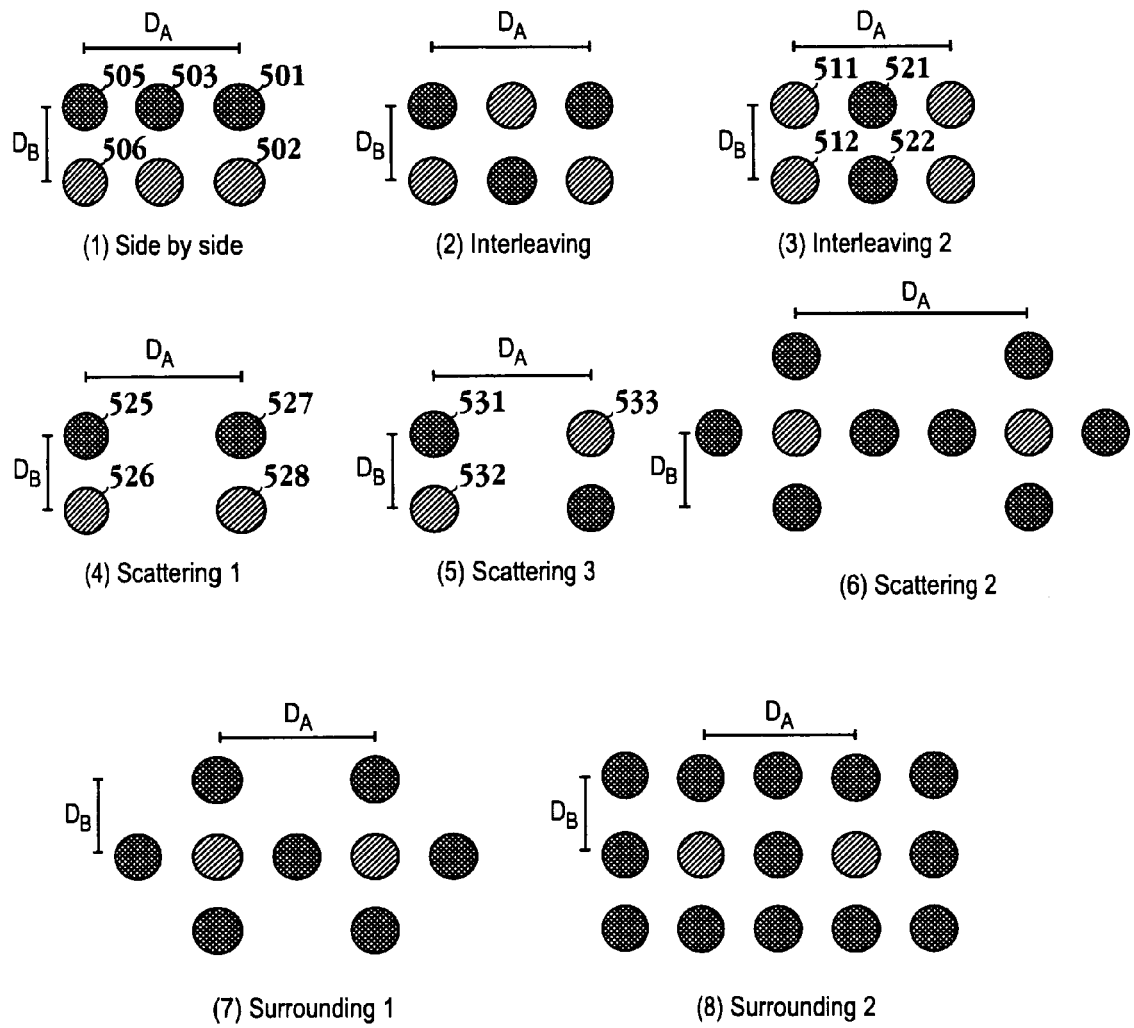
FIG. 5A shows eight exemplary via layout patterns for a power distribution network, in accordance with one embodiment of the present invention.

FIG. 5A shows eight patterns of via layout. Each of the illustrated circles in FIG. 5A has a diameter that represents the largest diameter needed to define a plated through hole for power paths or ground paths. As shown in FIG. 1B, the plated through hole 134 has the largest diameter of the via, and thus, this diameter is the one used for layout of the circles in FIG. 5A. The PTHs 501 with crossed lines inside represent ground paths. The PTHs 502 with slanted lines represent power paths. Design (1) is referred to herein as a "side by side" (or "sidebyside") design. The distance between the center of PTH 501 and the center of PTH 505 is $D_A$. The distance between the center of PTH 505 and PTH 506 is $D_B$. In one embodiment, $D_A$ is about 1 mm and $D_B$ is about 0.5 mm. The second design, which is referred to herein as an "interleaving" design, has alternating power paths and ground paths. The third design, which is referred to herein as an "interleaving2" design, has two power paths 511, 512, next to two ground paths 521, 522. The fourth pattern, which is referred to herein as a "scattering1" design, has ground path 525 and power path 526 separated by distance $D_B$. Ground paths 525 and 527 are separated by distance $D_A$. The distance $D_A$ between is larger than the distance $D_B$.

The fifth pattern, which is referred to herein as a "scattering3" design, has alternating ground paths and power paths, but the distance $D_A$ between ground path 531 and power path 533 is larger than the distance $D_B$ between ground path 531 and power path 532. The sixth pattern, which is referred to herein as a "scattering2" design, has each of the power paths 541, 542, surrounded by 4 ground paths 543. The seventh pattern, which is referred to herein as a "surrounding1" design, has each of the two power paths 511, 552, surrounded by 4 ground paths 553; however, the ground path 553 between power paths 551, 552 are shared. The eighth pattern, which is referred to herein as a "surrounding2" design, has each of the power paths 561, 562 surrounded by 8 ground paths; however the ground path 563 between the power paths 561, 562 are shared.

Simulations for the eight patterns in FIG. 5A are conducted by keeping $D_A$ at 1 mm and $D_B$ at 0.5 mm in all eight patterns the same in order to compare the patterns. The simulation program used is Si2D by Ansoft of Pittsburgh, Pa. Si2D is a quasi-static electromagnetic-field simulation for parasitic extraction of electronic components program. The simulation is only conducted on PTHs, which have the longest lengths and largest diameters in the via stacks of substrate 105.

FIG. 5B shows a summary of simulated loop inductance L in pH (pico Henry) for the eight patterns in FIG. 5A with power path PTH counts, which is described as VCCN PTH counts. VCCN is the power supply to the different banks in the package. The "Total PTHs" in FIG. 5B stand for the total number of PTHs corresponding to the VCCN PTH count. Inductance L for each of the eight via layout patterns is simulated and compared. For each pattern, VCCN PTH counts of 4, 8, and 16 are simulated. VCCN PTH counts are the PTH counts for power supply. For "side by side", "interleaving", "interleaving2", "scattering1", and "scattering3" patterns, the total number of PTH corresponding to each of the VCCN PTH counts is twice the number of the VCCN PTH count. However, for "scattering2", "surrounding1", and "surrounding2" patterns, the total number of PTH corresponding to each of the VCCN PTH counts is much higher than the other five patterns. Higher number of total PTHs generally requires larger chip areas, since each PTH requires chip area and space is required to separate PTHs. Therefore, "scattering2", "surrounding1," and "surrounding2" patterns occupy more chip areas than the other five patterns. In addition, the manufacturing cost is higher for higher number of PTHs.

FIG. 6 shows compares the lowest loop inductance of FIG. 5B for different layout patterns. FIG. 6 also includes the "Total PTHs" of the lowest loop inductance for each pattern. Although "surrounding1" has the lowest loop inductance of 19 pH, the total number of PTHs is 65. In contrast, "interleaving" pattern has loop inductance of 25.5 pH, which is only slightly higher than 19 pH, but the total PTHs is only 32, which is much lower than 65. As discussed above, larger number of total PTHs requires larger chip area. Chip area is limited on the chip. There might not be enough chip area to accommodate 65 total PTHs. In addition, manufacturing cost is higher for 65 total PTHs, compared to 32 total PTHs. Therefore, although "surrounding1" pattern yields lowest inductance, it might not be the via layout pattern of choice.

Figure 7A:
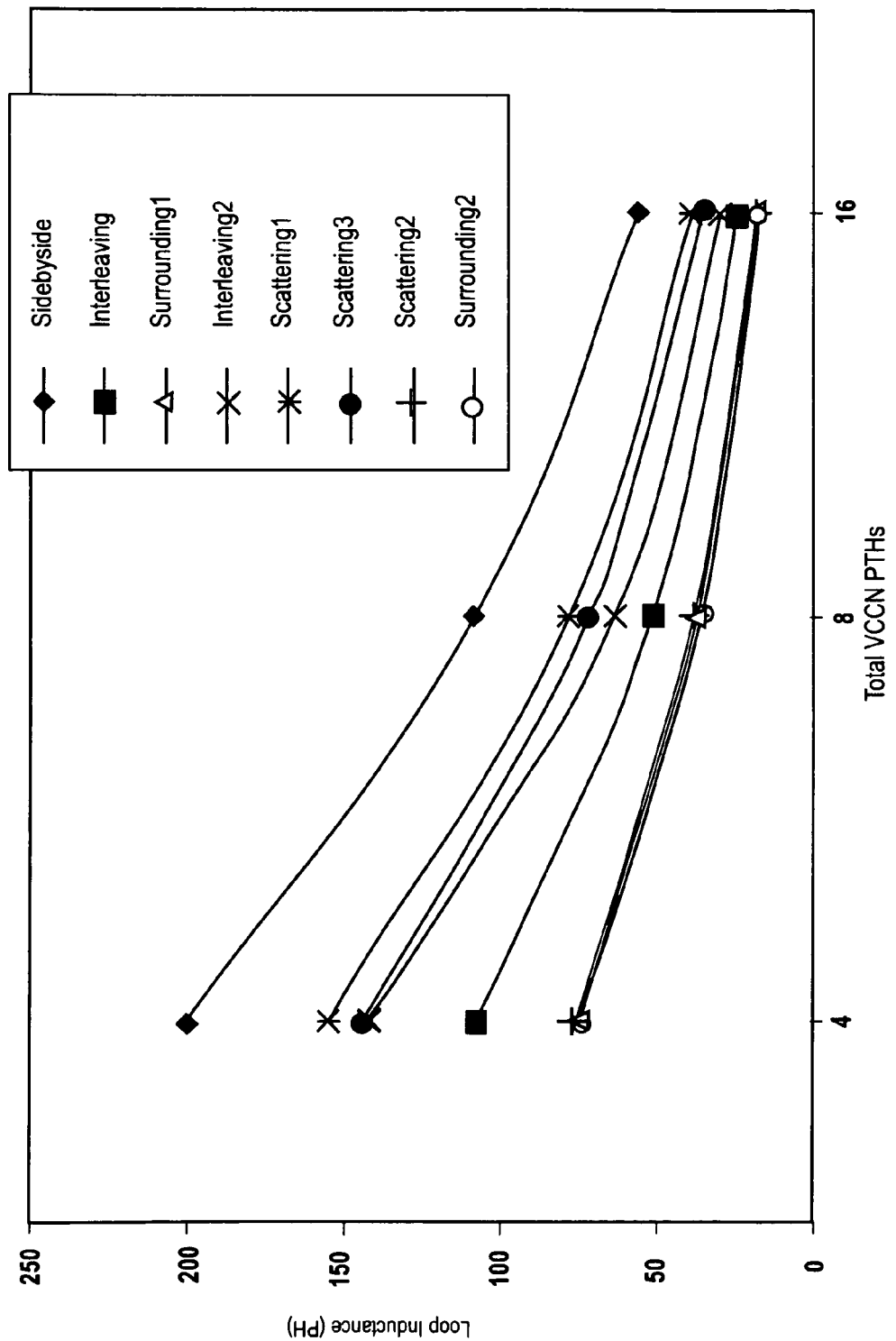
FIG. 7A shows a graph of simulated loop inductance with the number of total power PTHs, in accordance with one embodiment of the present invention.
Figure 7B:
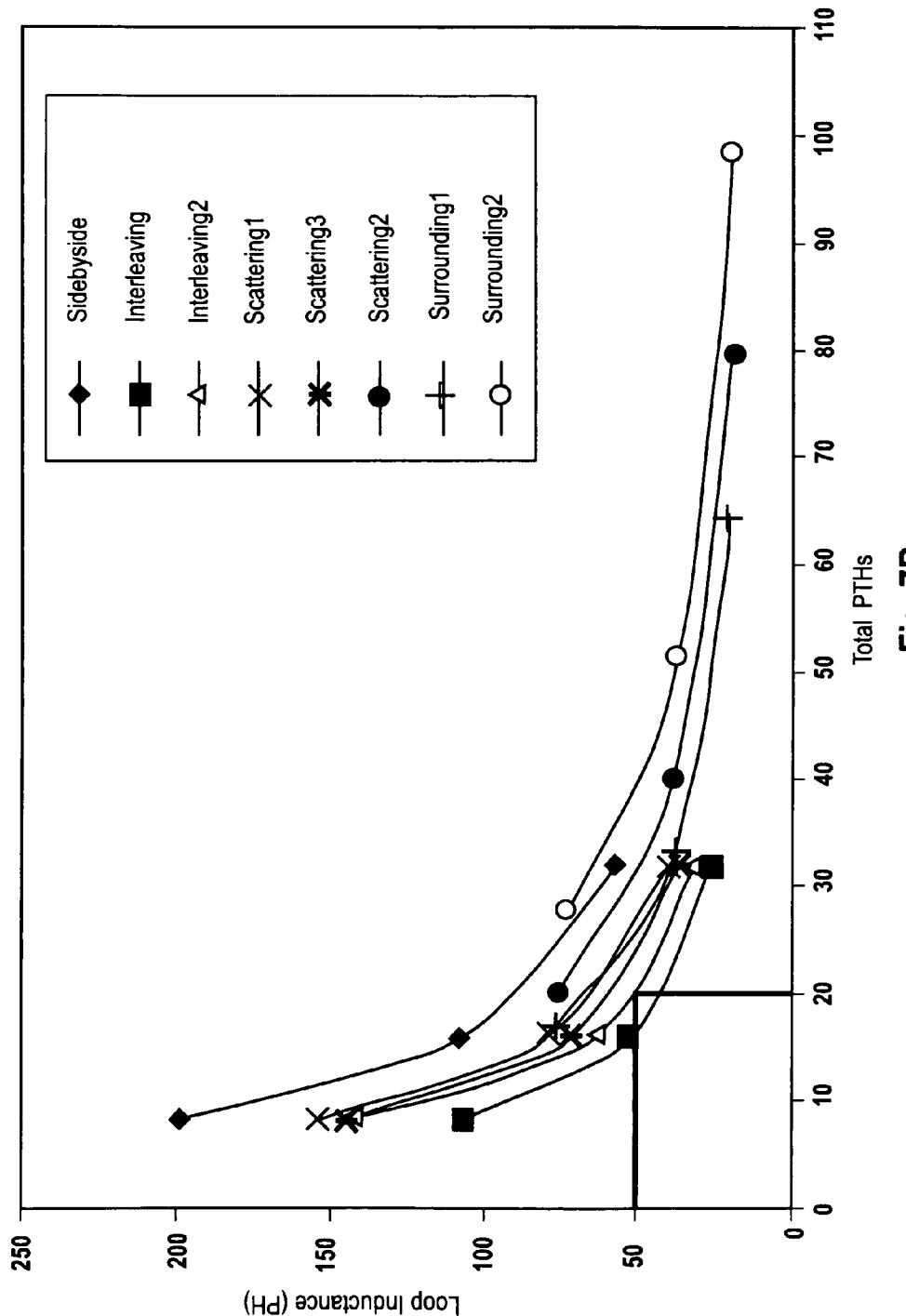
FIG. 7B shows a graph of simulated loop inductance with the number of total PTHs, in accordance with one embodiment of the present invention.

The simulated results of FIG. 5B are plotted as a function of VCCN PTH in FIG. 7A and as a function of Total PTHs in FIG. 7B. FIG. 7A shows that "surrounding1" and "surrounding2" patterns have the lowest loop inductance L, when plotted as a function of total VCCN PTHs. However, both "surrounding1" and "surrounding2" patterns have high numbers of ground PTHs surrounding the power PTHs (or VCCN PTH), as seen in FIGS. 5A and 5B. As described earlier, both the manufacturing cost and chip area required increase with the number of total PTHs. FIG. 7B, with loop inductance L plotted as a function of "Total PTHs", can reflect the manufacturing/chip-area cost (by the total number of PTHs) and loop inductance (L) for all patterns.

As shown in FIG. 7B, loop inductance L decreases with the number of total PTHs, which is consistent with previous discussion. FIG. 7B also shows that "interleaving" pattern has the lowest loop inductance with the lowest number of total PTHs. For example, the loop inductance is 52 pH when the total number of PTHs is 16, as shown in FIG. 7B and FIG. 5B "interleaving2" and "scattering3" patterns also have relatively low loop inductance with low number of total PTH. With a plot such as FIG. 7B, the layout designer can determine via (or PTH) layout pattern based on the total PTHs allowed, which is determined by the chip area and manufacturing cost, and the loop inductance required to have acceptable ΔV.

Figure 8:
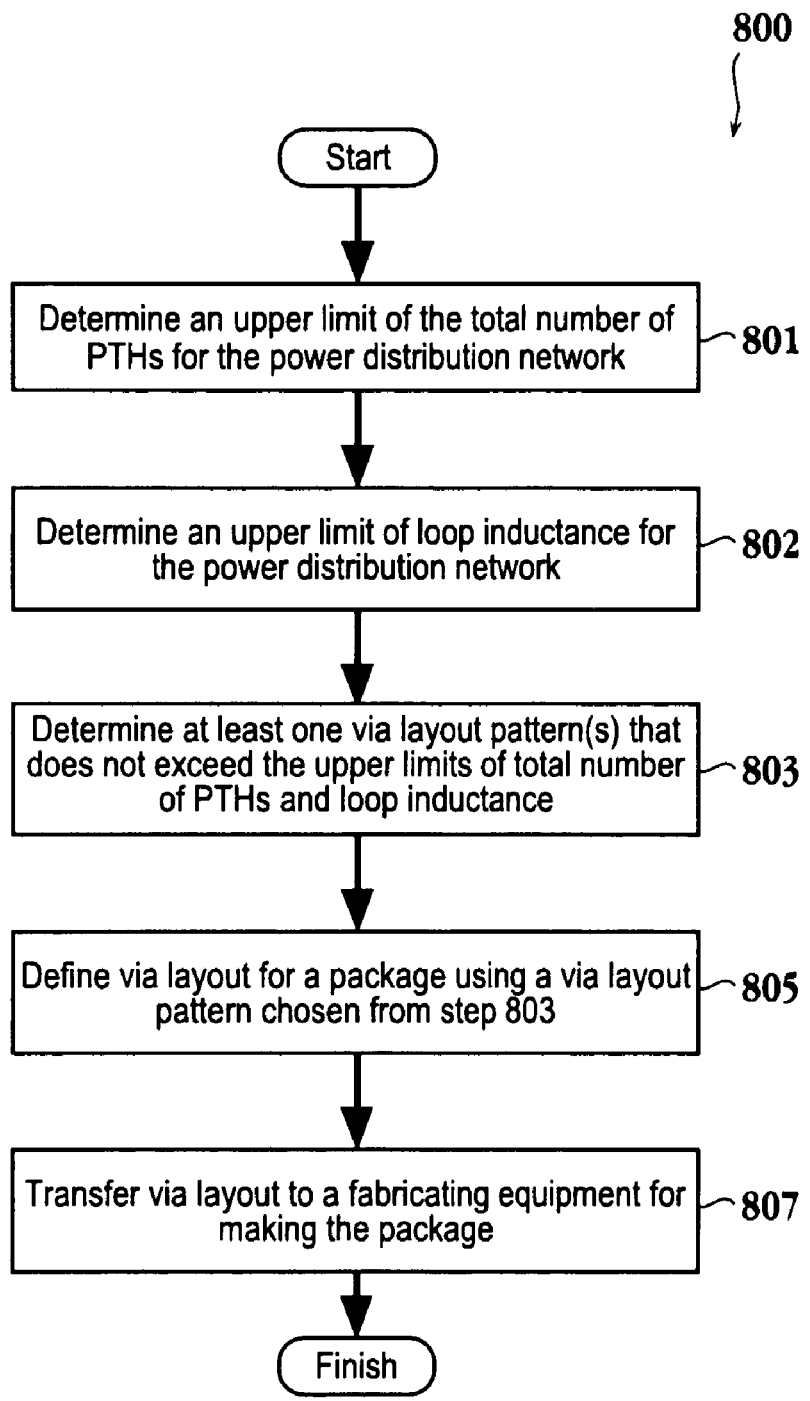
FIG. 8 shows a process flow for determining a via layout pattern for a power distribution network, in accordance with one embodiment of the present invention.

FIG. 8 shows a process flow 800 for determining the via layout pattern for the power distribution network, in accordance with one embodiment of the present invention. At step 801, an upper limit of the total number of PTHs is determined. The total number of PTHs is limited by the total chip area available. In addition to the restriction of chip area, manufacturing cost can also affect the decision in determining the total number of PTHs. At step 802, an upper limit of loop inductance is determined. The upper limit of loop inductance produces a ΔV low enough that the ΔV would not degrade the performance of the device(s). At step 803, via layout pattern(s) is determined by using the total number of PTHs obtained from step 801 and the loop inductance limit determined from step 803. In one embodiment, the via layout pattern(s) can be determined by using a graph, such as FIG. 7B by choosing layout pattern(s) that does not exceed the upper loop inductance. For example, if the total number of PTH is 20 and the loop inductance limit is 50, the layout patterns, that would not exceed loop inductance, include "interleaving" and "surrounding1", as observed in FIG. 7B. The layout of PTHs can be designed using a pattern (or one of the patterns) chosen in the previous step at step 805. Once the layout pattern of the PTHs is determined, the layout of micro vias can be easily determined. The via layout pattern is transferred to a fabricating equipment for making the via pattern for the package at step 807.

Figure 9:
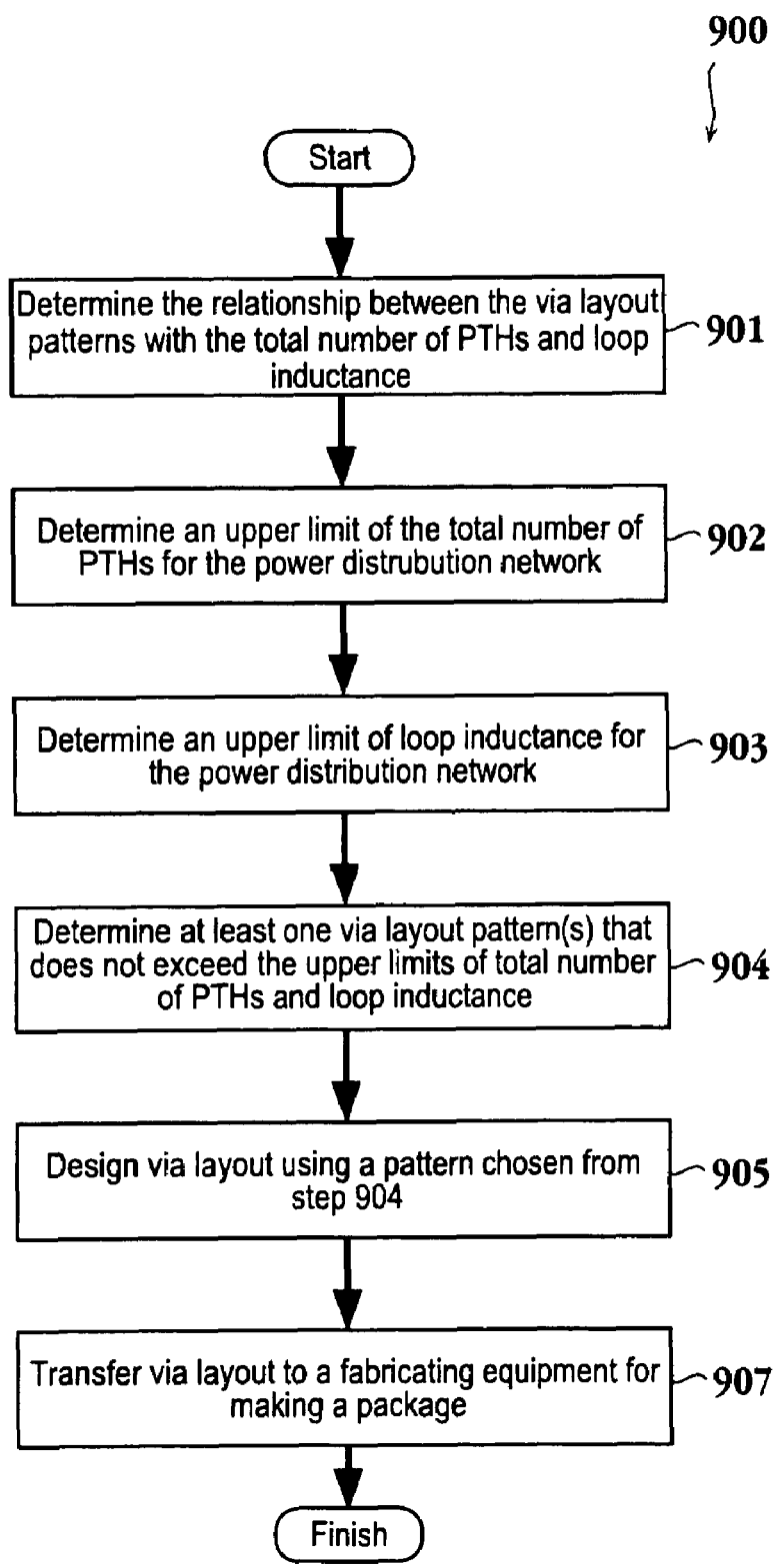
FIG. 9 shows another process flow for determining a via layout pattern for a power distribution network, in accordance with one embodiment of the present invention.

FIG. 9 shows a process flow 900 for determining the via layout for power distribution network, in accordance with one embodiment of the present invention. At step 901, the relationship between various via layout patterns with loop inductance and total number of PTHs is determined. The via layout pattern is for designing layout for power paths and ground paths for any supply (or operating) voltage. In one embodiment, the relationship is determined by simulation. The simulated results can be tabular or graphed. Interpolation may be used to estimate the relationship for data points not collected. At step 902, the upper limit of total number of PTHs for the power distribution network is determined. The upper limit of total number of PTHs is determined by the total chip area available. In addition to chip area, manufacturing cost can also affect the decision in determining the total number of PTHs. In step 903, an upper limit of loop inductance for the power distribution network is determined. The upper limit of loop inductance produces a ΔV low enough that the ΔV would not degrade the performance of the device(s). In step 904, via layout pattern(s) is determined by using the total number of PTHs obtained from step 902, the loop inductance limit determined from step 904, and the relationship determined in step 901. In one example, but not limited thereto, the relationship determined in step 901 can be represented by a graph, such as FIG. 7B. Via layout pattern(s) that does not exceed the upper loop inductance and total number of PTHs is selected. For example, if the total number of PTH is 20 and the loop inductance limit is 50, the layout patterns, that would not exceed loop inductance, include "interleaving" and "surrounding1", as observed in FIG. 7B. At step 905, the PTH layout is designed using a pattern chosen from step 904. If at step 904 multiple via layout patterns meet the selection criteria, any one of the patterns can be used. Once the layout pattern of the PTHs, which is the same as the via layout pattern, is determined, the layout of micro vias can be set. At step 907 the via pattern is transferred to a fabricating equipment for making the via patterns for the package.

The embodiments of this invention are described to provide methods in designing, optimizing, and implementing package substrate plated through holes and micro vias for critical power distribution networks in packages. The benefits of using methods described above include improved packaging electrical performance, improved layout efficiency and consistency. The benefits also include optimization to tie PTHs/micro-vias electrical performance directly to process feasibility and fabrication cost. The method may also serve as a design guideline for package design to reduce the design cycle time.

The embodiments of this invention provide various patterned via (or PTH) structures to deliver different values of loop inductance under given process flow and cost constrains. The embodiments of this invention also provide modularized via (or PTH) structures (or patterns) with predictable electrical performance. The modularized via patterns provide effective and consistent package power distribution network routing.

While this invention has been described in terms of several embodiments, it will be appreciated that those skilled in the art upon reading the preceding specifications and studying the drawings will realize various alterations, additions, permutations and equivalents thereof. Therefore, it is intended that the present invention includes all such alterations, additions, permutations, and equivalents as fall within the true spirit and scope of the invention.

What is claimed is:

1. A method for forming a package for a semiconductor die, comprising:
    determining an upper limit of total number of vias available for a power distribution network for the package;
    determining an upper limit of loop inductance for the semiconductor die, wherein the upper limit of loop inductance for the semiconductor die creates a threshold voltage ($\Delta V$) low enough that the $\Delta V$ does not affect the operation of devices coupled to the power distribution network on the semiconductor die;
    determining at least one via layout pattern, the loop inductance of the at least one via layout pattern not exceeding the upper limit of loop inductance, an upper limit of total number of vias of the at least one via layout pattern not exceeding the upper limit of total number of vias available for the power distribution network for the package, the at least one via layout pattern defining a placement relationship between vias used for power and vias used for ground; and
    packaging the semiconductor die wherein the at least one via layout pattern is utilized for the package.

2. The method of claim 1, wherein the defined placement relation for the at least one via layout pattern is selected from the group consisting of sidebyside, interleaving, interleaving2, scattering1, scattering3, scattering2, surrounding1, and surrounding2.

3. The method of claim 1, wherein the defined placement relation for the chosen via layout pattern is interleaving.

4. The method of claim 1, wherein each of the vias of the total number of vias includes a plated through hole and at least one micro via.

5. The method of claim 1, wherein determining the upper limit of total number of vias is constrained by available chip area on the package for the power distribution network.

6. The method of claim 1, wherein the loop inductance of the at least one via layout pattern is determined by simulation.

7. The method of claim 1, wherein the upper limit of loop inductance is lower for a lower operating voltage for the devices coupled to the power distribution network on the semiconductor die.

8. A method for forming a package for a semiconductor die, comprising:
    determining a functional relationship between via layout patterns and loop inductance of via layout patterns;
    determining an upper limit of total number of vias available for a power distribution network for the package;
    determining an upper limit of loop inductance for the semiconductor die, wherein the upper limit of loop inductance for the semiconductor die creates a threshold voltage ($\Delta V$) low enough that the $\Delta V$ does not affect the operation of devices coupled to the power distribution network on the semiconductor die;
    determining at least one via layout pattern of the plurality of via layout patterns that does not exceed the upper limit of loop inductance and the upper limit of total number of vias, the at least one via layout pattern defining a placement relationship between vias used for power and vias used for ground; and
    forming the package based on the determining of the at least one via layout pattern.

9. The method of claim 8, wherein the defined placement relation for the at least one via layout pattern is selected from the group consisting of sidebyside, interleaving, interleaving2, scattering1, scattering3, scattering2, surrounding1, and surrounding2.

10. The method of claim 8, wherein the defined placement relation for a chosen via layout pattern is interleaving.

11. The method of claim 8, wherein each of the vias of the total number of vias includes a plated through hole and at least one micro via.

12. The method of claim 8, wherein determining the upper limit of total number of vias is constrained by available chip area on the package for the power distribution network.

13. The method of claim 8, wherein the loop inductance of the each of the plurality of via layout patterns is determined by simulation.

14. The method of claim 8, wherein the upper limit of loop inductance is lower for a lower operating voltage for the devices coupled to the power distribution network on the semiconductor die.

15. A method for packaging a semiconductor die, comprising:
    determining a functional relationship between via layout patterns and loop inductance of via layout patterns
    examining a layout of a package to determine an upper limit of total number of vias available for a power distribution network for the package;
    identifying acceptable loop inductance for the semiconductor die, wherein the acceptable loop inductance for the semiconductor die defines a threshold voltage ($\Delta V$) low enough that the $\Delta V$ does not delay on/off operation of devices coupled to the power distribution network on the semiconductor die;
    identifying a via layout pattern from the via layout patterns for the package, the via layout pattern being substantially within an upper limit of loop inductance and an upper limit of total number of vias, the via layout pattern establishing a physical placement relationship between vias used for power and vias used for ground; and
    forming the package that includes the at least one via layout pattern.

16. The method of claim 15, wherein the upper limit of total number of vias is constrained by available chip area on the package for the power distribution network.

17. The method of claim 15, wherein the physical placement relation for the via layout pattern is selected from the group consisting of sidebyside, interleaving, interleaving2, scattering1, scattering3, scattering2, surrounding1, and surrounding2.

* * * * *